United States Patent
Lin et al.

[11] Patent Number: 5,960,284
[45] Date of Patent: Sep. 28, 1999

[54] METHOD FOR FORMING VERTICAL CHANNEL FLASH MEMORY CELL AND DEVICE MANUFACTURED THEREBY

[75] Inventors: Chrong Jung Lin, Hsin-Tein; Shui-Hung Chen, Hsin-Chu; Jong Chen, Taipei; Di-Son Kuo, Hsinchu, all of Taiwan

[73] Assignee: Taiwan Semiconductor Manufacturing Company, Ltd., Hsin-Chu, Taiwan

[21] Appl. No.: 08/985,647

[22] Filed: Dec. 5, 1997

[51] Int. Cl.⁶ .................................................. H01L 21/8247
[52] U.S. Cl. ......................... 438/259; 438/268; 438/291
[58] Field of Search .................................. 438/257–267, 438/289, 291, 268; 257/316

[56] References Cited

U.S. PATENT DOCUMENTS

| | | | |
|---|---|---|---|
| 5,017,977 | 5/1991 | Richardson | 257/316 |
| 5,045,490 | 9/1991 | Esquivel et al. | 437/43 |
| 5,071,782 | 12/1991 | Mori . | |
| 5,078,498 | 1/1992 | Kadakia et al. | 257/316 |
| 5,278,438 | 1/1994 | Kim et al. | 257/316 |
| 5,315,142 | 5/1994 | Acovic et al. | 257/316 |
| 5,414,287 | 5/1995 | Hong | 257/316 |
| 5,460,988 | 10/1995 | Hong . | |
| 5,554,550 | 9/1996 | Yang | 437/43 |
| 5,563,083 | 10/1996 | Pein | 437/43 |
| 5,595,926 | 1/1997 | Tseng | 437/52 |
| 5,705,415 | 1/1998 | Orlowski et al. . | |

*Primary Examiner*—Richard Booth
*Attorney, Agent, or Firm*—George O. Saile; Stephen B. Ackerman; Graham S. Jones, II

[57] ABSTRACT

A vertical memory device on a silicon semiconductor substrate is formed by the following steps. Form an array of isolation silicon oxide structures on the surface of the silicon semiconductor substrate. Form a floating gate trench in the silicon semiconductor substrate between the silicon oxide structures in the array, the trench having trench sidewall surfaces. Dope the sidewalls of the floating gate trench with a threshold implant through the trench sidewall surfaces. Form a tunnel oxide layer on the trench sidewall surfaces, the tunnel oxide layer having an outer surface. Form a floating gate electrode in the trench on the outer surface of the tunnel oxide layer. Form source/drain regions in the substrate self-aligned with the floating gate electrode. Form an interelectrode dielectric layer over the top surface of the floating gate electrode. Form a control gate electrode over the interelectrode dielectric layer over the top surface of the floating gate electrode. Form a source line by the step of performing a self-aligned etch followed by a source line implant.

20 Claims, 8 Drawing Sheets

METHOD FOR FORMING VERTICAL CHANNEL FLASH MEMORY CELL AND DEVICE MANUFACTURED THEREBY

BACKGROUND OF THE INVENTION

1. Field of the Invention

This invention relates to semiconductor memory devices and more particularly to vertical channel flash memory devices.

2. Description of Related Art

1. To maintain enough current through the channel, the memory cell takes more area with traditional ETOX (EPROM with Tunnel OXide) structure since the channel is parallel to the wafer surface.

2. During the programming and the erasing procedures, the tunneling electron always needs to traverse (pass through) part of the channel area resulting in charge trapping and transconductance degradation.

SUMMARY OF THE INVENTION

In accordance with this invention, a method of forming a vertical memory device on a silicon semiconductor substrate is performed by the following steps. Form an array of isolation silicon oxide structures on the surface of the silicon semiconductor substrate. Form a floating gate trench in the silicon semiconductor substrate between the silicon oxide structures in the array, the trench having trench surfaces. Dope the sidewalls of the floating gate trench with a threshold implant through the trench sidewall surfaces. Form a tunnel oxide layer on the trench sidewall surfaces, the tunnel oxide layer having outer surfaces. Form a floating gate electrode in the trench on the outer surface of the tunnel oxide layer. Form source/drain regions in the substrate self-aligned with the floating gate electrode. Form an interelectrode dielectric layer over the top surface of the floating gate electrode. Form a control gate electrode over the interelectrode dielectric layer over the top surface of the floating gate electrode.

Preferably, the tunnel oxide layer has a thickness from about 70 Å to about 150 Å; the trench has a depth from about 2,000 Å to about 8,000 Å; the floating gate electrode comprises doped polysilicon having a thickness of from about 1,000 Å to about 4,000 Å; the threshold implant comprises boron which was implanted with a concentration of dopant from about 1 E 16 atoms/cm$^3$ to about 5 E 17 atoms/cm$^3$; source/drain regions were ion implanted with a concentration of arsenic dopant from about 1 E 15 atoms/cm$^3$ to about 5.5 E 15 atoms/cm$^3$; a source line region is provided on the source side of the trench aligned with and adjacent to the source region. Preferably, form a source line by the step of performing a self-aligned etch followed by a source line implant. Dope the source line region with an N type dopant selected from the group consisting of arsenic and phosphorus atoms which were implanted at an energy from about 30 keV to about 55 keV with a dose from about 1 E 14 ions/cm$^2$ to about 5 E 14 ions/cm$^2$.

In accordance with another aspect of this invention, a vertical memory device on a silicon semiconductor substrate is provided including the following features. An array of isolation silicon oxide structures are formed on the surface of the silicon semiconductor substrate. There is a floating gate trench in the silicon semiconductor substrate between the silicon oxide structures in the array, the trench having trench sidewall surfaces. The sidewalls of the floating gate trench are doped with a threshold implant through the trench sidewall surfaces. There is a tunnel oxide layer on the trench sidewall surfaces. The tunnel oxide layer has an outer surface. There is a floating gate electrode in the trench on the outer surface of the tunnel oxide layer. Source/drain regions are formed in the substrate self-aligned with the floating gate electrode. An interelectrode dielectric layer overlies the top surface of the floating gate electrode. A control gate electrode overlies the interelectrode dielectric layer above the top surface of the floating gate electrode. There is an ion implanted source line formed in the substrate after a self-aligned etch.

Preferably, the trench has a depth from about 2,000 Å to about 8,000 Å. The tunnel oxide layer has a thickness from about 70 Å to about 150 Å. The floating gate electrode comprises doped polysilicon having a thickness of from about 1,000 Å to about 4,000 Å. The threshold implant comprises ion implantation of boron fluoride ions which were ion implanted at an energy from about 20 keV to about 50 keV with a dose from about 1 E 12 ions/cm$^2$ to about 5 E 13 ions/cm$^2$. The source/drain implant comprises arsenic which was ion implanted at an energy from about 30 keV to about 55 keV with a dose from about 1 E 15 ions/cm$^2$ to about 5.5 E 15 ions/cm$^2$ with a dopant concentration after annealing from about 1 E 20 atoms/cm$^3$ to about 5 E 21 atoms/cm$^3$. A source line was formed after a self-aligned etch to a depth from about 1,000 Å to about 3,000 Å on the source side of the trench. The source line was formed by an implant provided by ion implantation of dopant selected from the group consisting of arsenic and phosphorus ions implanted at an energy from about 30 keV to about 55 keV with a dose from about 1 E 14 ions/cm$^2$ to about 5 E 14 ions/cm$^2$.

Features of this Invention

1. A cell structure in accordance with this invention uses a vertical channel rather than a traditional horizontal one.
2. Since the channel has a vertical orientation with respect to the wafer surface, the activity area of the cell in accordance with this invention can be larger while requiring less silicon surface area compared to a conventional cell with an ETOX structure. Therefore, the unit cell will requires less silicon surface area compared to a conventional one.
3. Only a single mask is required to conduct stacking gate etching of a memory cell and control gate etching of peripheral devices simultaneously instead of two masks employed separately for a conventional ETOX structure.
4. During the erasing procedure, the band-to-band hot hole phenomenon can be completely prevented with a memory cell, in accordance with this invention.

BRIEF DESCRIPTION OF THE DRAWINGS

The foregoing and other aspects and advantages are explained and described below with reference to the accompanying drawings, in which:

FIGS. 2A and 2B show the device of FIGS. 1A and 1B after etching of an active area pattern in the silicon nitride layer.

FIGS. 3A and 3B show the device of FIGS. 2A and 2B after growth of isolation field oxide (FOX) regions 18 where the pad oxide layer is exposed through windows through silicon nitride layer.

FIGS. 4A and 4B show the device of FIGS. 3A and 3B after formation of second photoresist mask which comprises a floating gate mask with a transverse slot therethrough above the sites where the floating gates are to be formed.

FIGS. 5A and 5B show the device of FIGS. 4A and 4B after etching of the pad oxide layer and down into the substrate to form a set of floating gate trenches to prepare space for floating gate electrodes formed over gate oxide layers.

FIGS. 6A and 6B show the device of FIGS. 5A and 5B after a tilted angle cell threshold implant has been applied at a large tilt angle to make sure the sidewalls of the trenched silicon have the correct dosage in sidewall regions.

FIGS. 7A and 7B show the device of FIGS. 6A and 6B after the photoresist mask and the silicon nitride layer have both been stripped from the device.

FIGS. 9A and 9B show the device of FIGS. 8A and 8B during self-aligned S/D implantation of dopant ions in FIG. 9B into the exposed portions of substrate forming source/drain regions as shown in FIG. 9A.

DESCRIPTION OF THE PREFERRED EMBODIMENT

Figure 1A:
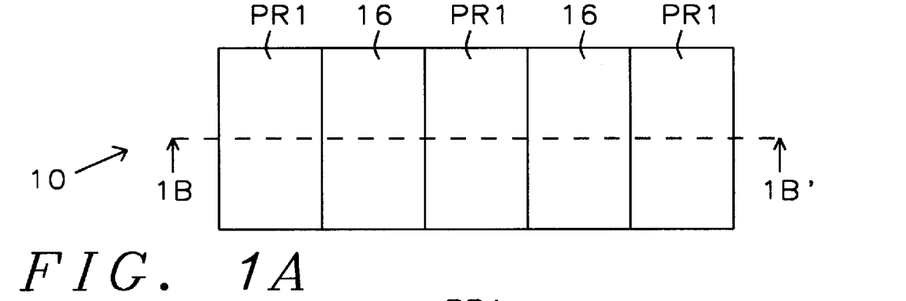
FIG. 1A shows a plan view of a fragment of an EPROM device in accordance with this invention in an early stage of manufacture.
Figure 1B:
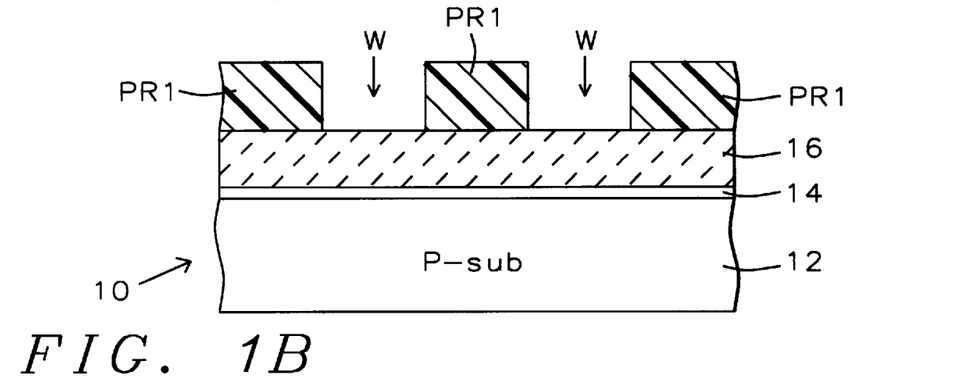
FIG. 1B shows the device of FIG. 1A taken along line 1B–1B' in FIG. 1A.

FIG. 1A shows a plan view of a fragment of an EPROM device 10 in accordance with this invention in an early stage of manufacture. FIG. 1B shows the device 10 of FIG. 1A taken along line 1B–1B' in FIG. 1A. The process of this invention, commences with formation of a pad oxide (thermal oxide) layer 14 on a P-doped silicon semiconductor substrate 12. Then a silicon nitride layer 16 is deposited on pad oxide layer 14. Then an active area (OD) photoresist mask PR1 with windows W therethrough is formed over the silicon nitride layer 16 for use in defining an active region in the device 10.

Figure 2A:
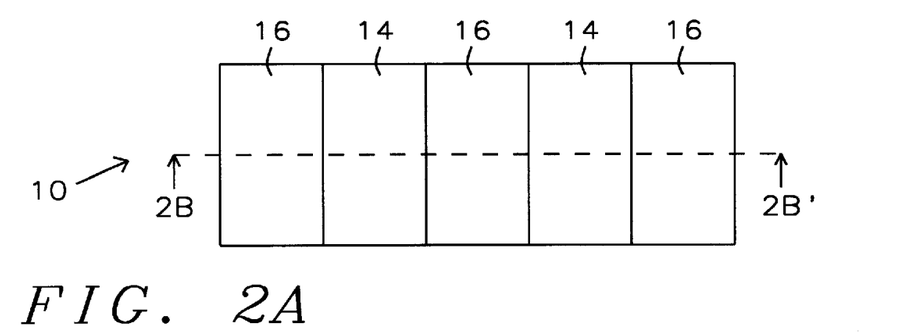
Figure 2B:
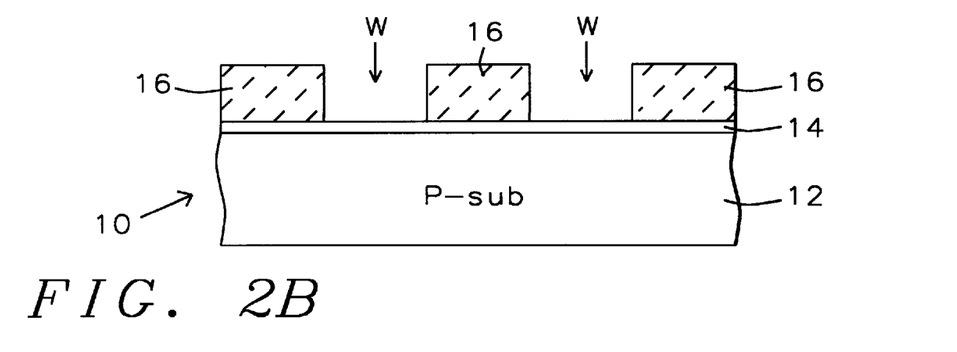
FIG. 2B shows a section taken along line 2B–2B' of FIG. 2A.

FIGS. 2A and 2B show the device 10 of FIGS. 1A and 1B after etching of an active area (OD) pattern in the silicon nitride layer 16. FIG. 2B shows a section along line 2B–2B' of FIG. 2A. Windows W are etched through layer 16 in the pattern of the windows W in the photoresist mask PR1.

Figure 3A:
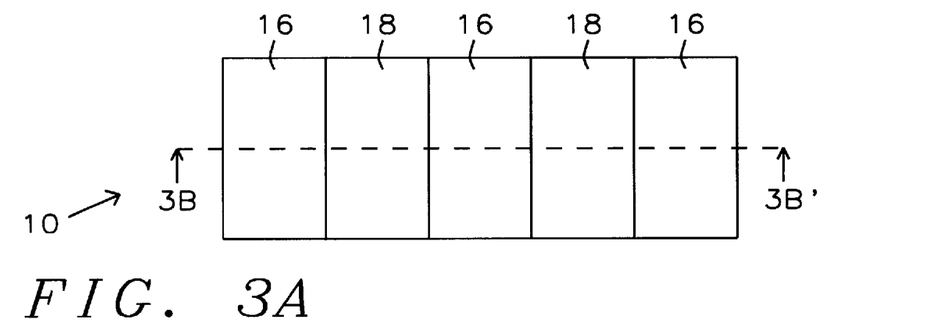
Figure 3B:
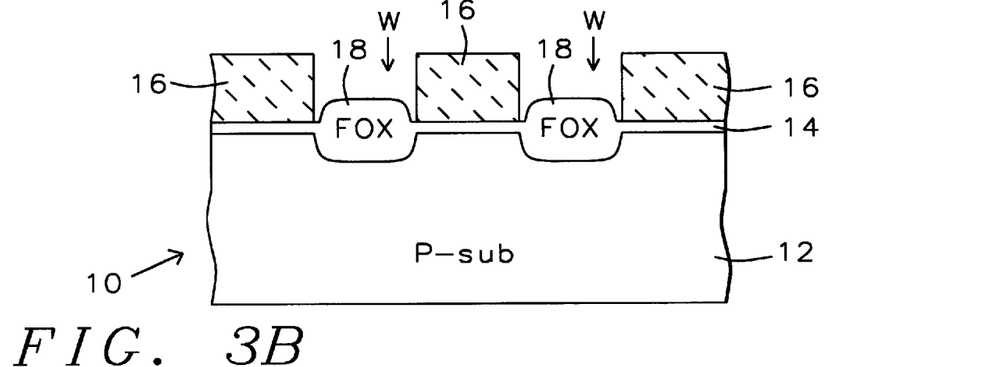
FIG. 3B shows a section taken along line 3B–3B' of FIG. 3A.

FIGS. 3A and 3B show the device 10 of FIGS. 2A and 2B after growth of isolation field oxide (FOX) regions 18 where the pad oxide layer 14 is exposed through windows W through silicon nitride layer 16.

FIG. 3B shows a section taken along line 3B–3B' of FIG. 3A.

Figure 4A:
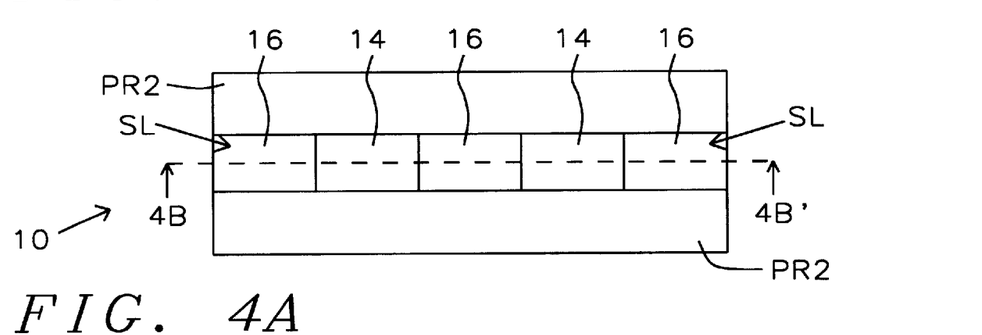
Figure 4B:
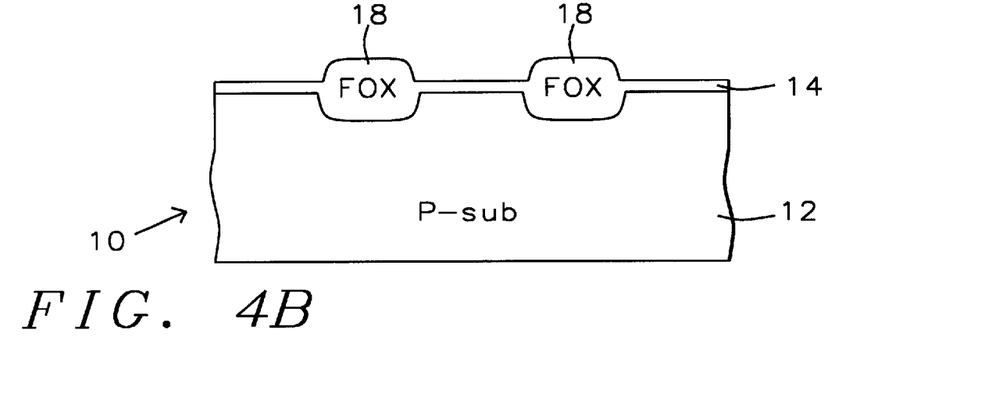
FIG. 4B shows a section taken along line 4B–4B' of FIG. 4A.

FIGS. 4A and 4B show the device 10 of FIGS. 3A and 3B after formation of second photoresist mask PR2 comprising a floating gate mask with a transverse slot SL therethrough above the sites where the floating gates are to be formed.

FIG. 4B shows a section taken along line 4B–4B' of FIG. 4A.

Where the slot SL reaches through the mask PR2 (separating mask PR2 into a pair of parallel strips) the silicon nitride layer 16 is stripped away exposing the pad oxide layer 14 and the FOX regions 18, as seen in the section shown in FIG. 4B in preparation for forming a set of trenches 20 (FIG. 5A and 5B) in the silicon semiconductor substrate 12 which are to be defined by the field oxide (FOX) regions 18 and the slot SL in the second photoresist mask PR2.

Figure 5A:
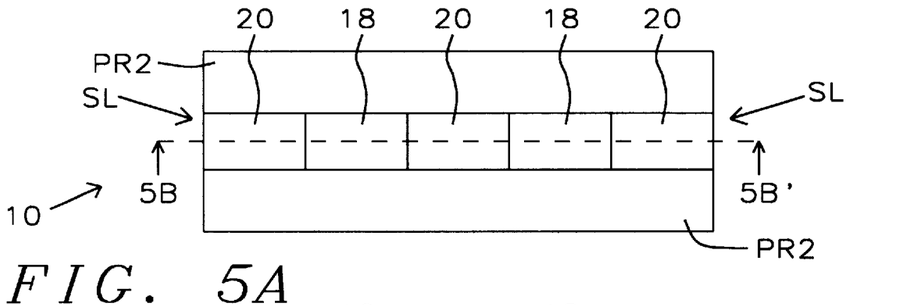
Figure 5B:
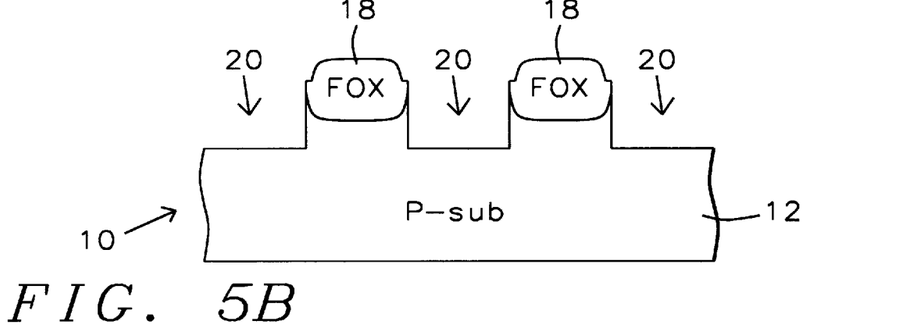
FIG. 5B shows a section taken along line 5B–5B' of FIG. 5A.

FIGS. 5A and 5B show the device 10 of FIGS. 4A and 4B after etching of the pad oxide layer 14 and down into the substrate 12 to form a set of floating gate trenches 20 through the slot SL in mask PR2 to prepare space for floating gate electrodes 24 formed over gate oxide layers 23. The trenches 20 in the silicon semiconductor substrate 12 are self-aligned with the FOX regions 18.

FIG. 5B shows a section taken along line 5B–5B' of FIG. 5A. The trenches 20 have a depth from about 2,000 Å to about 8,000 Å.

Figure 6A:
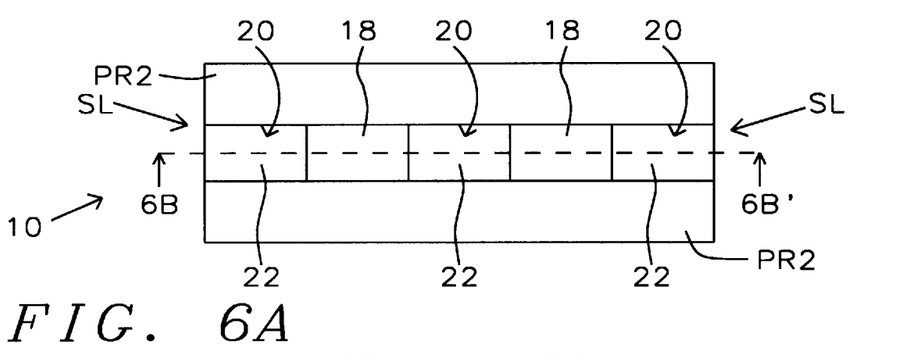
Figure 6B:
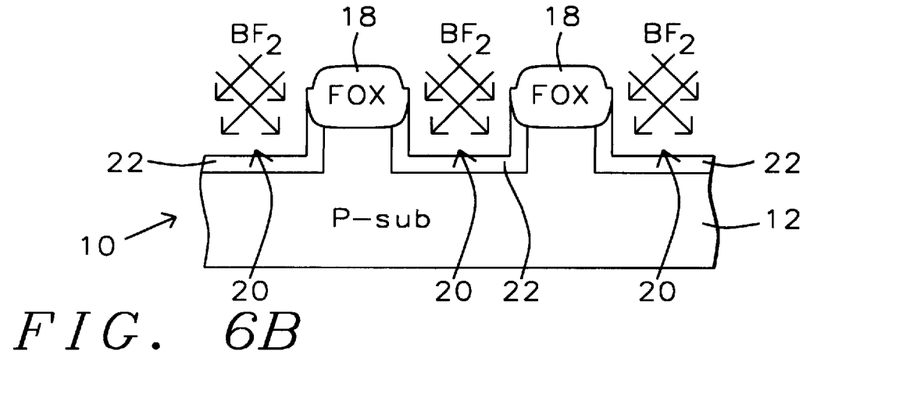
FIG. 6B shows a section taken along line 6B–6B' of FIG. 6A.

FIGS. 6A and 6B show the device 10 of FIGS. 5A and 5B after a tilted angle cell threshold implant of boron fluoride $BF_2$ has been applied into the sidewall regions 22 of the trenches 20 at a large tilt angle $\Theta$ to make sure the sidewalls 22 of the trenches 20 in silicon semiconductor substrate 12 have the correct dosage in sidewall regions 22.

FIG. 6B shows a section taken along line 6B–6B' of FIG. 6A.

The dopant comprises boron fluoride ions which were ion implanted at an energy from about 20 keV to about 50 keV with a dose from about 1 E 12 ions/cm$^2$ to about 5 E 13 ions/cm$^2$. After annealing the concentration of the dopant was from about 5 E 16 atoms/cm$^3$ to about 5 E 17 atoms/cm$^3$.

Figure 7A:
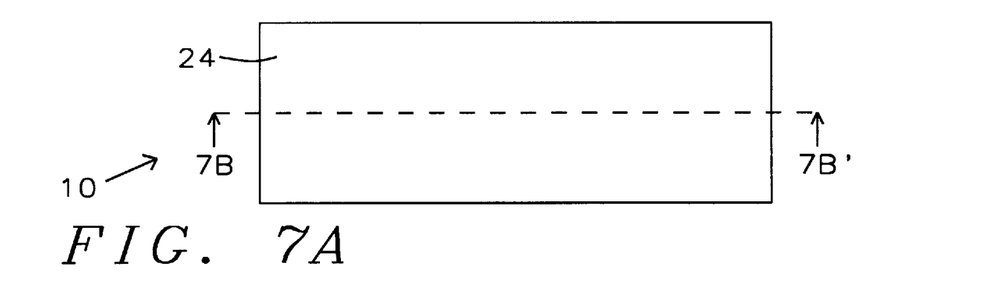
Figure 7B:
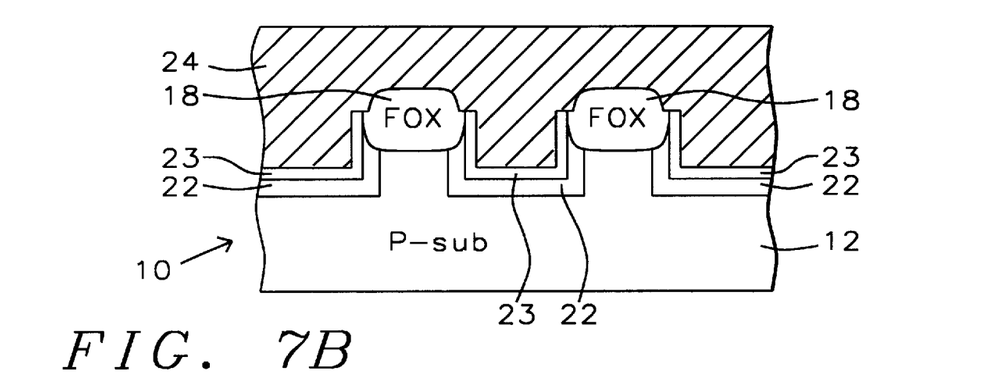
FIG. 7B shows a section taken along line 7B–7B' of FIG. 7A.

FIGS. 7A and 7B show the device 10 of FIGS. 6A and 6B after the photoresist mask PR2 and the silicon nitride layer 16 have both been stripped from the device 10.

FIG. 7B shows a section taken along line 7B–7B' of FIG. 7A.

Thereafter a tunnel oxide (silicon oxide) layer 23 is grown. Next, a blanket floating gate polysilicon is deposited to fill up the trenches 20 covering the tunnel oxide layer 23 and FOX regions 18. The tunnel oxide layer 23 has a thickness from about 70 Å to about 150 Å, and the floating gate electrode has a thickness of from about 1,000 Å to about 4,000 Å.

Subsequently, referring to FIGS. 8A and 8B the device 10 of FIGS. 7A and 7B is subjected to selectively etching back the polysilicon layer 24. Etching is employed to remove the surplus amount of polysilicon layer 24 on the tunnel oxide layer 23 above spaces where the source/drain regions S/D are to be formed as shown in FIG. 9A.

Figure 8A:
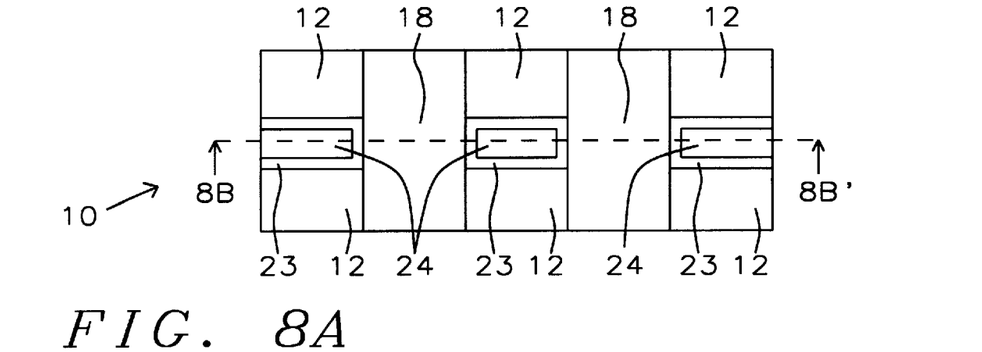
FIGS. 8A and 8B show the device of FIGS. 7A and 7B after being subjected to a process of selectively etching back the polysilicon layer to remove the surplus polysilicon on the tunnel oxide layer above the spaces where the source/drain regions are to be formed as shown in FIG. 9A.
Figure 8B:
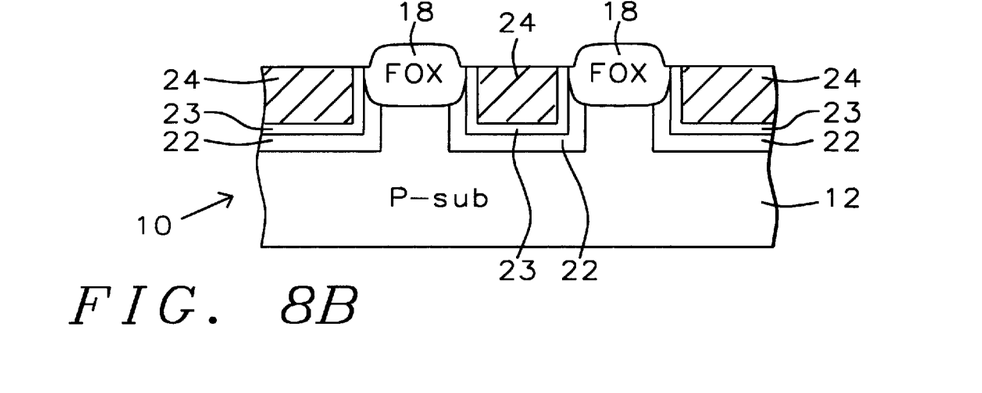
Figure 9A:
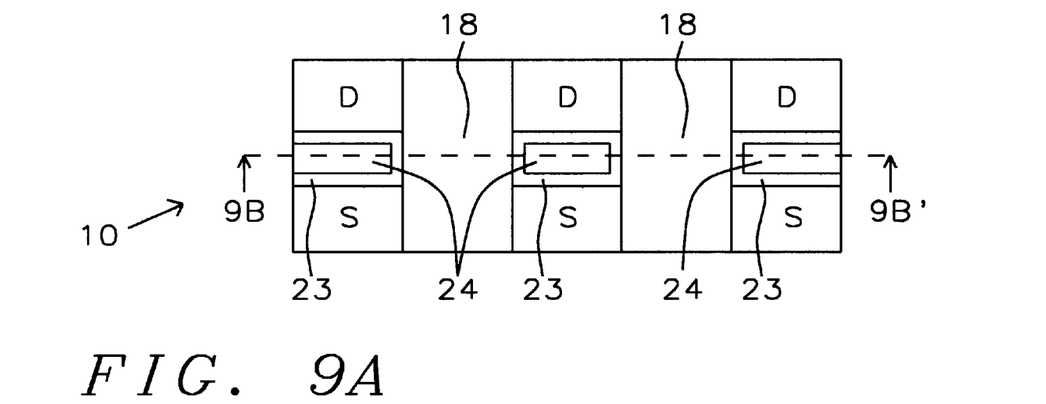
Figure 9B:
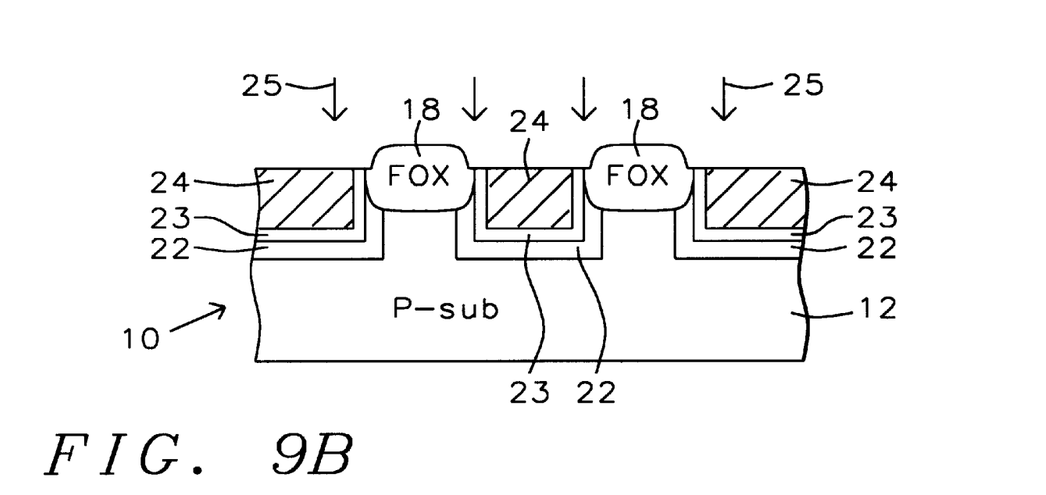
FIG. 9B shows a section taken along line 9B–9B' of FIG. 9A.

Referring to FIGS. 9A and 9B the device 10 of FIGS. 8A and 8B is shown during self-aligned S/D implantation of N+ dopant ions 25 in FIG. 9B into the exposed portions of substrate 12 forming source regions S and drain regions D as shown in FIG. 9A.

FIG. 9B shows a section taken along line 9B–9B' of FIG. 9A.

The dopant 25 comprises arsenic ions which were ion implanted at an energy from about 30 keV to about 55 keV with a dose from about 1 E 15 ions/cm$^2$ to about 5.5 E 15 ions/cm$^2$. The resulting dopant concentration after annealing was from about 1 E 20 atoms/cm$^3$ to about 5 E 21 atoms/cm$^3$.

Figure 10A:
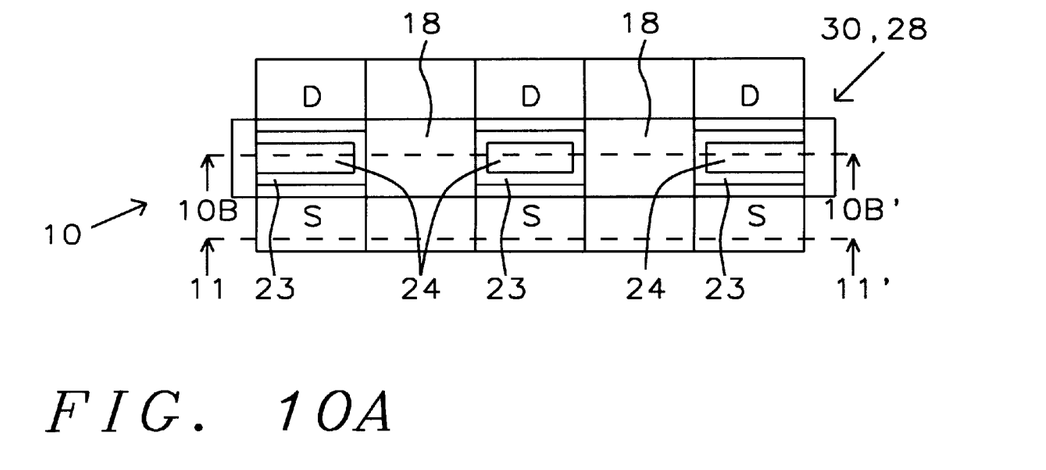
FIG. 10A is a section taken along line 10A–10A' of the device of FIG. 10B below the level of the ONO dielectric layer.
Figure 10B:
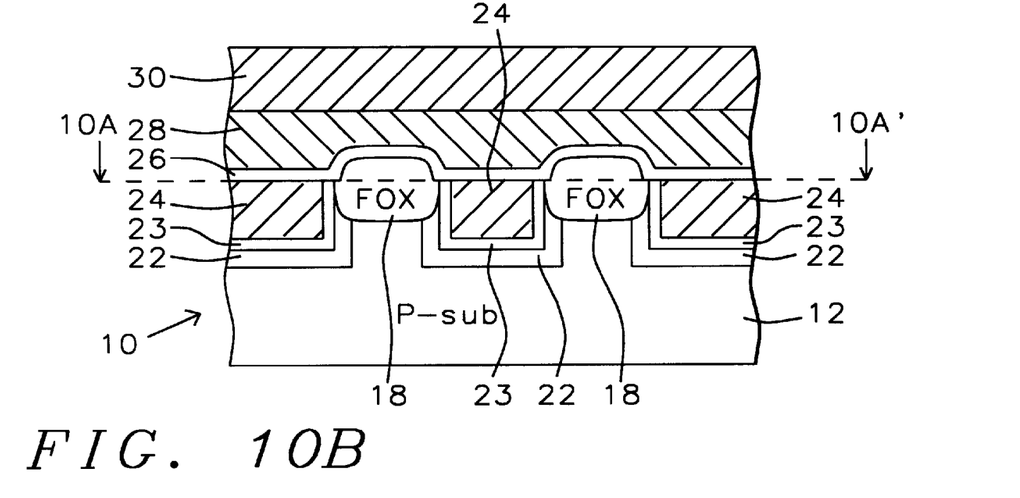
FIG. 10B shows the device of FIG. 9B (in an elevational section) after an ONO (silicon oxide/silicon nitride/silicon oxide) interconductor dielectric layer has been grown to separate the floating gate electrodes from the control gate electrode to be formed next.

Referring to FIG. 10B the device 10 of FIG. 9B is shown (in an elevational section) after an ONO (silicon oxide/silicon nitride/silicon oxide) interconductor dielectric layer 26 has been grown to separate the floating gate electrodes 24 from the control gate electrode to be formed next.

FIG. 10A is a section taken along line 10A–10A' of the device of FIG. 10B below the level of the ONO dielectric layer 26.

Above ONO dielectric layer 26, a polysilicon layer 28 and tungsten silicide layer 30 were deposited on a step-by-step basis in preparation for forming the control gate electrode 30, 28 seen in phantom in FIG. 10A.

The pattern of the control gate polysilicon layer 28, and tungsten silicide layer 30 were defined by a conventional control gate mask (not shown) to produce the pattern shown in phantom in FIG. 10A.

Figure 11:
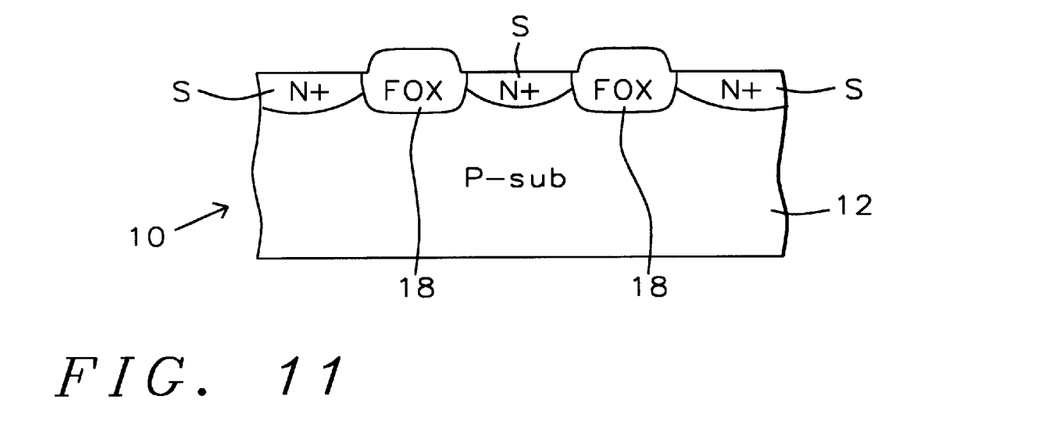
FIG. 11 shows a vertical section of the device of FIG. 10A taken along line 11–11' therein through the source regions of the device which are separated by the FOX regions.

FIG. 11 shows a vertical section of the device 10 of FIG. 10A taken along line 11–11' therein. FIG. 11 shows a section passing through the source regions S of the device 10 which are separated by the FOX regions 18.

Figure 12:
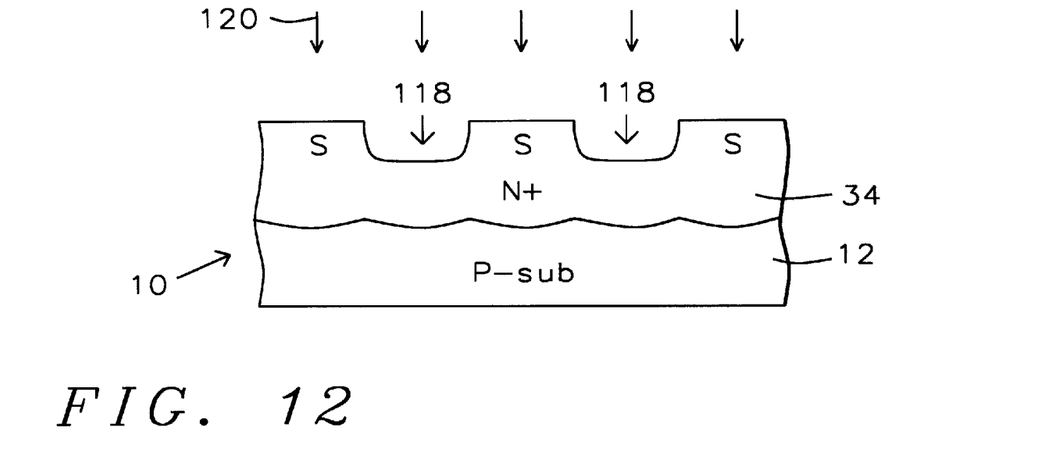
FIG. 12 shows the vertical section of device shown in FIG. 11 after removal of FOX regions (isolation oxide) located between the N+source regions of the memory cell to a substantial depth within the substrate.

FIG. 12 shows the vertical section of device 10 shown in FIG. 11, but after a self-aligned source line mask (not shown) has been employed to form a source line by removing the FOX regions 18 (isolation oxide) located between the N+ source regions S of the memory cell to a depth from about 1,000 Å to about 3,000 Å. Ion implantation with ions 120 for the source line 34 is also aligned by the same mask as was used to remove the FOX regions 18 leaving valleys 118 in FIG. 11 where the FOX regions 18 had been. The source line implant with ions 120 comprises ion implantation of arsenic or phosphorus ions which are ion implanted at an energy from about 30 keV to about 55 keV with a dose from about 1 E 14 ions/cm$^2$ to about 5 E 14 ions/cm$^2$.

After tungsten silicide annealing, N+/P+ S/D implants are made for the peripheral devices which are conducted with the appropriate masks (not shown). The dopant comprises arsenic ions which were ion implanted at an energy from about 30 keV to about 55 keV with a dose from about 1 E 15 ions/cm$^2$ to about 5 E 15 ions/cm$^2$. After annealing, the concentration of the dopant was from about 1 E 20 atoms/cm$^3$ to about 5 E 21 atoms/cm$^3$.

Figure 13:
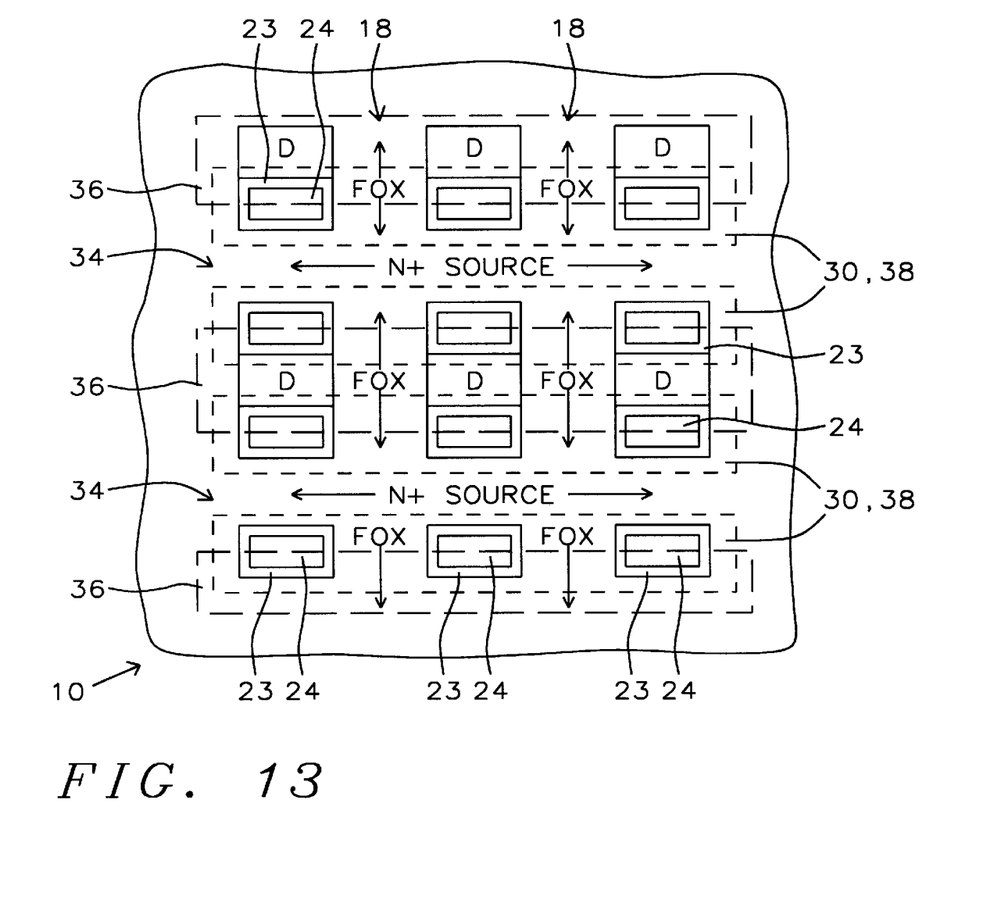
FIG. 13 shows the device of FIGS. 10, 11, and 12 in plan view with additional parts of the device illustrated.

FIG. 13 shows the device of FIGS. 10, 11, and 12 (in plan view) illustrating additional parts of the device 10.

As the ILD (Inter Layer Dielectric) is coated, contact holes and contact implants are defined by a contact mask.

After a tungsten plug is deposited and etched back, the metal layer is coated and defined by a metal layer mask. Then IMD (Inter Metal Dielectric), VIA and METAL masks are used to conduct the back end process.

Figure 14:
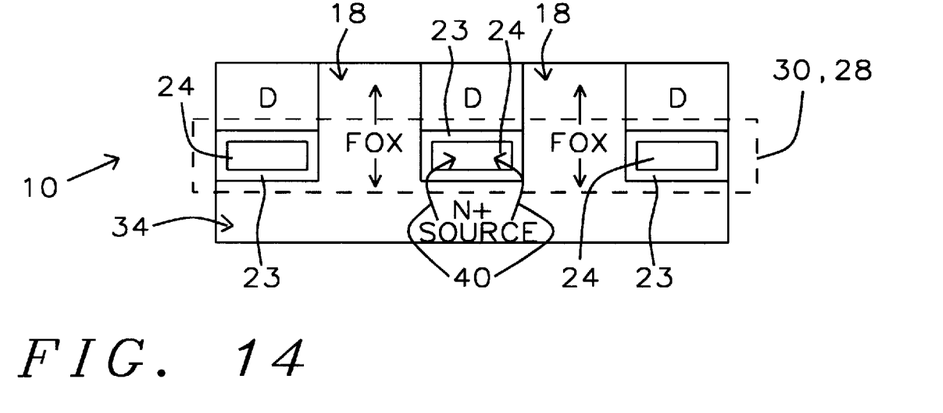
FIGS. 14–16 show the portions of the device of FIG. 13 for programming, erasing and reading operations respectively.
Figure 15:
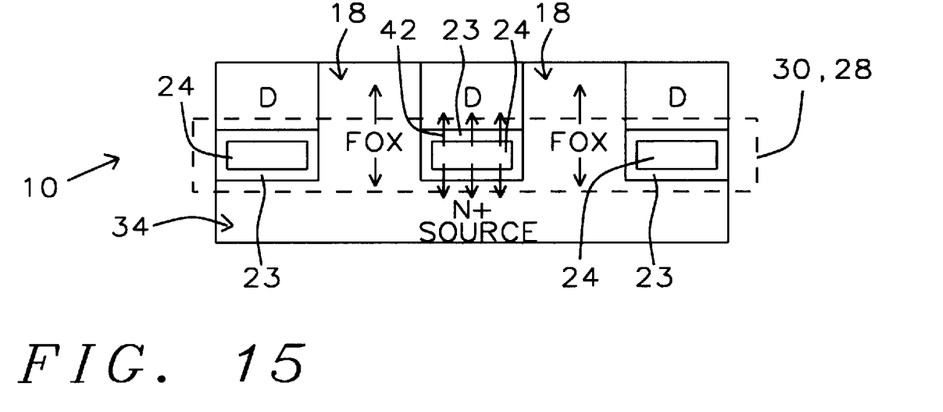
Figure 16:
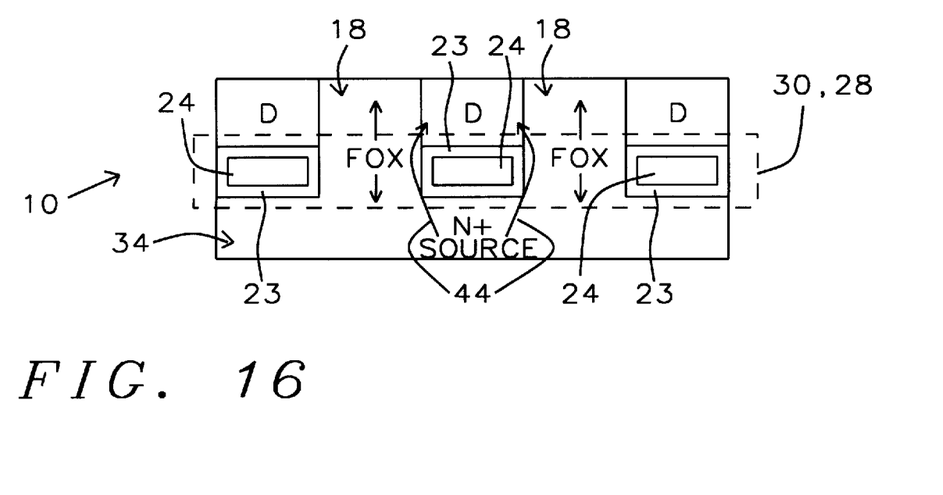

FIGS. 14–16 show the portions of the device 10 of FIG. 13 for programming, erasing and reading operations respectively.

For the operation modes, channel hot electron programming is shown in FIG. 14. During programming there are hot electron paths 40 on vertical channel surfaces. During programming, the voltages are as follows:

$V_D=V_{CC}$, $V_{CG}=V_{high}$, and $V_S=V_B=0$.

The Fowler-Nordheim (FN) tunneling erase operation is illustrated in FIG. 15 with electron tunneling paths 42 on source/drain S/D sides of the device. During erasing the voltages are as follows:

$V_D=V_S=V_{high}$, $V_{CG}=0$, and $V_B$ is Floating.

Reading is shown in FIG. 16 where electron paths 44 extend from source to drain sides. During reading the voltages are as follows:

$V_D=V_{CC}$, $V_{CG}=V_{CC}$, $V_S=V_B=0$

The operation conditions of the memory cell illustrated by FIGS. 14–16 are listed in Table I.

TABLE I

| Memory Cell Operation Condition | | | | |
|---|---|---|---|---|
| | | Prog. | Erase | Read |
| Bit Line (Drain) | Selected | $V_{cc}$ | $V_{high}$ | $V_{cc}$ |
| | Unselected | 0 | 0 | 0 |
| Word Line (Gate) | Selected | $V_{high}$ | 0 | $V_{cc}$ |
| | Unselected | 0 | 0 | 0 |
| Source | Selected | 0 | $V_{high}$ | 0 |
| | Unselected | 0 | 0 | 0 |
| Buck | Selected | 0 | 0 | Floating |
| | Unselected | 0 | 0 | 0 |

Conclusions

The problems solved by a vertical EPROM device in accordance with this invention are as follows:
1. Packing density is increased since the unit cell requires less silicon surface area but with more channel area.
2. Because the floating gate is under the wafer surface, the profile of the stacking gate above the silicon surface is the same as that of the peripheral devices. Therefore, the stacking gate etching can be done simultaneously with the control gate etching for peripheral devices.
3. The processing of the proposed memory cell is more comparable with that of the peripheral devices.
4. The tunnel oxide which is used for erasing, is located between the source/drain and the floating gate and does not overlap with the channel region. Therefore, the band-to-band hot hole phenomenon can be completely prevented during the erasing procedure, since the conventional P-N junction formed from the source/drain regions with the bulk region of the device is not involved in this cell structure.
5. Since the part of the tunnel oxide used for erasing is not located at the channel, the problematical window closing behavior, which has been caused during erasing, can be avoided.
6. Because the area of the tunnel oxide between the source/drain regions and the floating gate electrode is much larger than that of the traditional structure, the result is that the erasing speed is much faster.
7. Drain saturation current (IDsat) of the memory cell is enhanced since the channel area can be increased without requiring more wafer surface area.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming a vertical memory device on a silicon semiconductor substrate by the steps as follows:

forming an array of isolation silicon oxide structures on the surface of said silicon semiconductor substrate, forming a floating gate trench in said silicon semiconductor substrate between said silicon oxide structures in said array, said trench having trench sidewalls with sidewall surfaces, doping said sidewalls of said floating gate trench with a threshold implant through said sidewall surfaces, forming a tunnel oxide layer having an outer surface on said sidewall surfaces, forming a floating gate electrode in said trench on said outer surface of said tunnel oxide layer, forming source/drain regions in said substrate self-aligned with said floating gate electrode, forming an interelectrode dielectric layer over the top surface of said floating gate electrode, and forming a control gate electrode over said interelectrode dielectric layer over the top surface of said floating gate electrode.

2. A method of forming a memory device in accordance with claim 1 wherein:

said trench has a depth from about 2,000 Å to about 8,000 Å.

3. A method of forming a memory device in accordance with claim 1 wherein:

said tunnel oxide layer has a thickness from about 70 Å to about 150 Å, and said floating gate electrode has a thickness of from about 1,000 Å to about 4,000 Å.

4. A method of forming a memory device in accordance with claim 1 wherein:

said threshold implant comprises ion implantation of boron fluoride ions which were ion implanted at an energy from about 20 keV to about 50 keV with a dose from about 1 E 12 ions/cm$^2$ to about 5 E 13 ions/cm$^2$.

5. A method of forming a memory device in accordance with claim 1 wherein:

said source/drain region formation comprises ion implantation of arsenic ions which were ion implanted at an energy from about 30 keV to about 55 keV with a dose from about 1 E 15 ions/cm$^2$ to about 5.5 E 15 ions/cm$^2$.

6. A method of forming a memory device in accordance with claim 1 wherein:

said floating gate electrode comprises doped polysilicon with a thickness from about 1,000 Å to about 4,000 Å.

7. A method of forming a memory device in accordance with claim 1 wherein:

a source line is formed by the step of performing a self-aligned etch and source line implantation on the source side of said trench.

8. A method of forming a memory device in accordance with claim 1 wherein:

a source line implant into said substrate is provided by ion implantation of dopant ions selected from the group consisting of arsenic and phosphorus ions implanted at an energy from about 30 keV to about 55 keV with a dose from about 1 E 14 ions/cm$^2$ to about 5 E 14 ions/cm$^2$.

9. A method of forming a memory device in accordance with claim 1 wherein:

a source line region is formed on the source side of said trench by the step of performing a self-aligned etch to a depth from about 1,000 Å to about 3,000 Å, and performing source line implantation into said source line region.

10. A method of forming a memory device in accordance with claim 1 wherein:

a source line is formed by the step of performing a self-aligned etch to a depth from about 1,000 Å to about 3,000 Å and source line implantation on the source side of said trench, and said source line implant comprises ion implantation of dopant ions selected from the group consisting of arsenic and phosphorus ions implanted at an energy from about 30 keV to about 55 keV with a dose from about 1 E 14 ions/cm$^2$ to about 5 E 14 ions/cm$^2$.

11. A method of forming a vertical memory device on a silicon semiconductor substrate by the steps as follows:

forming an array of isolation silicon oxide structures on the surface of said silicon semiconductor substrate, forming a floating gate trench in said silicon semiconductor substrate between said silicon oxide structures in said array, said trench having trench sidewalls with sidewall surfaces, doping the sidewalls of said floating gate trench with a threshold implant through said trench sidewall surfaces, forming a tunnel oxide layer on said trench sidewall surfaces, said tunnel oxide layer having an outer surface, forming a floating gate electrode in said trench on said outer surface of said tunnel oxide layer, forming source/drain regions in said substrate self-aligned with said floating gate electrode, forming an interelectrode dielectric layer over the top surface of said floating gate electrode, forming a control gate electrode over said interelectrode dielectric layer over the top surface of said floating gate electrode, and forming a source line by the steps of performing a self-aligned etch followed by a source line implant.

12. A method of forming a memory device in accordance with claim 11 wherein:

said trench has a depth from about 2,000 Å to about 8,000 Å.

13. A method of forming a memory device in accordance with claim 12 wherein:

said tunnel oxide layer has a thickness from about 70 Å to about 150 Å, and said floating gate electrode has a thickness of from about 1,000 Å to about 4,000 Å.

14. A method of forming a memory device in accordance with claim 13 wherein:

said threshold implant comprises ion implantation of boron fluoride ions which were ion implanted at an energy from about 20 keV to about 50 keV with a dose from about 1 E 12 ions/cm$^2$ to about 5 E 13 ions/cm$^2$.

15. A method of forming a memory device in accordance with claim 14 wherein:

said source/drain region formation comprises ion implantation of arsenic ions which were ion implanted at an energy from about 30 keV to about 55 keV with a dose from about 1 E 15 ions/cm$^2$ to about 5.5 E 15 ions/cm$^2$.

16. A method of forming a memory device in accordance with claim 15 wherein:

said floating gate electrode comprises doped polysilicon with a thickness from about 1,000 Å to about 4,000 Å.

17. A method of forming a memory device in accordance with claim 16 wherein:

a source line is formed by the step of performing a self-aligned etch and source line implantation on the source side of said trench.

18. A method of forming a memory device in accordance with claim 17 wherein:

a source line implant into said substrate is provided by ion implantation of dopant ions selected from the group consisting of arsenic and phosphorus ions implanted at an energy from about 30 keV to about 55 keV with a dose from about 1 E 14 ions/cm$^2$ to about 5 E 14 ions/cm$^2$.

19. A method of forming a memory device in accordance with claim 18 wherein:

a source line is formed by the step of performing a self-aligned etch to a depth from about 1,000 Å to about 3,000 Å and source line implantation on the source side of said trench, and said source line implant comprises ion implantation of dopant ions selected from the group consisting of arsenic and phosphorus ions implanted at an energy from about 30 keV to about 55 keV with a dose from about 1 E 14 ions/cm$^2$ to about 5 E 14 ions/cm$^2$.

20. A method of forming a memory device in accordance with claim 11 wherein:

said trench has a depth from about 2,000 Å to about 8,000 Å, said tunnel oxide layer has a thickness from about 70 Å to about 150 Å, said floating gate electrode has a thickness of from about 1,000 Å to about 4,000 Å, and said threshold implant comprises ion implantation of boron fluoride ions which were ion implanted at an energy from about 20 keV to about 50 keV with a dose from about 1 E 12 ions/cm$^2$ to about 5 E 13 ions/cm$^2$.

\* \* \* \* \*